United States Patent [19]

Corcoran

[11] Patent Number: 5,294,926

[45] Date of Patent: Mar. 15, 1994

[54] TIMING AND AMPLITUDE ERROR ESTIMATION FOR TIME-INTERLEAVED ANALOG-TO-DIGITAL CONVERTERS

[75] Inventor: John J. Corcoran, Portola Valley, Calif.

[73] Assignee: Hewlett-Packard Company, Palo Alto, Calif.

[21] Appl. No.: 960,478

[22] Filed: Oct. 9, 1992

[51] Int. Cl.$^5$ .................................. H03M 1/10
[52] U.S. Cl. ............................. 341/120; 341/118
[58] Field of Search ............... 341/120, 121, 118, 119, 341/155, 159

[56] References Cited

U.S. PATENT DOCUMENTS

| | | | |
|---|---|---|---|
| 4,736,189 | 4/1988 | Katsumata et al. | 341/120 |
| 4,763,105 | 8/1988 | Jenq . | |
| 4,968,988 | 11/1990 | Miki et al. | 341/141 |

OTHER PUBLICATIONS

Y. C. Jenq, "Digital Spectra of Non-uniformly Sampled Signals: Theories and Applications, Part III", I.E.E.E. Instr. and Meas. Technology Confer. Proc., 25-27 Apr. 1988, pp. 208-212.

*Primary Examiner*—Brian K. Young

[57] ABSTRACT

Methods for calibrating a plurality of N time-interleaved analog-to-digital converters (ADCs) for any integer $N \geq 2$ by detecting and/or correcting timing and amplitude errors therein, where each of the ADCs, numbered j=1, 2, ..., N has an identical clock frequency $f_c$ and period $T_c = (f_c)^{-1}$. Ideally, the N ADCs are clocked uniformly in time so that two consecutively clocked ADCs number j1 and j1+1 have effective sampling times that differ by time intervals of uniform length $\Delta t = T_c/N$. Ideally, the N ADCs also have identical gains from their analog input signals to their digital output signals. In a calibration procedure, all ADCs receive a common analog input signal $S_{in}(t) = A\sin[2\pi(1+s)f_c t]$, where s is a non-zero fractional number satisfying $-0.5 < s < 0.5$. The output signal values from ADC number j provide a set of ordered pairs of values $(t_i, D_{ij})$ for sampling times $t_i$, and the set of values $\{D_{ij}\}_i$ with j fixed is approximated by another set of values $\{V_{ij} = A_j \sin[2\pi s f_c t_i + \phi_j]\}_i$. Here, the amplitudes $A_j$ and phase angles $\phi_j$ are chosen to provide a best numerical fit to the set $\{D_{ij}\}_i$ for each j=1, 2, ..., N, according to some criterion. The phase differences $\Delta\phi_{j2,j1} = \phi_{j2} - \phi_{j1}$ are then determined and compared with the ideal phase difference value $\Delta\Phi_{j2,j1} = 2\pi(j2-j1)/N$ to determine if a relative timing error exists between ADCs number j1 and j2. In a similar manner, the amplitude differences $A_{j2} - A_{j1}$ are compared to determine if a relative gain error exists between ADCs number j1 and j2.

17 Claims, 3 Drawing Sheets

TIMING AND AMPLITUDE ERROR ESTIMATION FOR TIME-INTERLEAVED ANALOG-TO-DIGITAL CONVERTERS

TECHNICAL FIELD

This invention relates to determination of relative timing or amplitude errors between two or more analog-to-digital converters (ADCs) that are time-interleaved with one another.

BACKGROUND ART

Time-interleaved arrays of analog-to-digital converters (ADCs) are useful in increasing the effective rate at which data are delivered by a ADC system. In a typical application of time-interleaved ADCs, the ADC clock pulse sequences are staggered in time, and the ADCs make analog-to-digital conversions in a round robin fashion, sweeping through N converters in the order 1, 2, ..., N−1, N, 1, 2, ... in a familiar manner. When N identical ADCs are interleaved in this manner, an analog-to-digital conversion system can be provided with a sample rate that is N times faster than the rate available for an individual ADC.

One problem presented with this architecture is that errors arise if the collective sampling times of the N ADCs are not uniformly spaced in time. It is not enough that the individual clock pulse sequences be substantially identical. It is also required that consecutive clock pulses, belonging to adjacent clock pulse sequences, be spaced apart by a uniform time interval. And, with uniformly spaced clock pulses, there may still be nonuniform sample spacing mismatches in the time delays within the ADCs from the clock signals or analog input signals to the internal sampling circuit. In order to reduce the errors due to nonuniform ADC sample time spacing from any of these sources to less than one-half the value of the least significant bit (LSB) when the input signal frequency is one-half the sample frequency, the timing inaccuracy of the effective internal sampling times inter se must be less than $(\pi 2^K)^{-1}$ times the system sample period, where K is the number of bits of digitizer resolution. For example, for a 6-bit system, the timing inaccuracy must be less than 0.5 percent of the sample period. With a sample frequency of 4 GHz, this permitted timing inaccuracy is about 1.2 psec.

Although the staggered clock pulse sequences can be generated with logic circuits, the uncorrected timing accuracy for a 4 GHz system could easily be about 10 percent of the sample period, due to device mismatches in the logic circuits or ADCs. These timing errors, if they can be determined, can be corrected by inserting electronic components with variable time delay in the clock generation circuits and by tuning their time delays appropriately. Another problem encountered with an interleaved ADC system is mismatch in the gain or offset characteristics of the N ADCs. This mismatch reduces the signal-to-noise ratio of the ADC system, and thus the effective signal resolution. Gain and offset errors for low frequency input signals may be easily determined by applying two dc calibration signals to the ADC inputs. The ADC gain and offset adjustments may then be varied in a manual or automatic calibration procedure to eliminate these errors, a technique commonly practiced in the art.

For higher frequency input signals additional amplitude errors will occur if the ADC input bandwidths are not precisely matched. These errors can be eliminated or minimized, using a bandwidth adjustment to the ADC (such as a tunable filter), if such bandwidth errors can be determined.

Y. C. Jenq, in "Digital Spectra of Non-Uniformly Sampled Signals: Theories and Applications, Part III", I.E.E.E. Instr. and Meas. Technology Conference Proc., Apr. 25-27, 1988, pp. 208-212, and in U.S. Pat. No. 4,763,105, discloses a sampling time offset estimation algorithm for detecting relative timing error for each of a plurality of N ($\geq 2$) time-interleaved ADCs. Jenq uses a discrete Fourier transform to analyze the plurality of signals issuing from the N ADCs, and the actual sampling time offsets are determined by examining the magnitude of particular spectral components whose frequencies depend on the sampling frequency and upon a test input frequency. Amplitude errors in the Fourier output spectrum (due, for example, to use of a test frequency that is not exactly commensurate with the test interval, or to use of an Fast Fourier Transform (FFT) window function) will produce errors in the sampling time offset estimation. Producing a test frequency that is exactly commensurate with the test interval may require an expensive synthesized source to generate the test sine wave output. Furthermore, Jenq does not describe determination of the amplitude response of each of the N ADCs at the test frequency.

What is needed is a calibration technique for accurately determining the relative timing error of time-interleaved ADC signals in the absence of a precisely known input frequency which also allows determination of any amplitude errors due to bandwidth mismatch of the individual ADCs.

SUMMARY OF THE INVENTION

The above needs are met by a calibration method that examines the data from each ADC separately, rather than in a composite interleaved form as done by Jenq. The method uses a beat frequency test signal to determine the settings for individual clock delays in the ADC clock paths. The goal is to produce a uniform spacing in the staggered or interleaved clock pulses to within a small timing inaccuracy. A test sine wave is applied to the analog input terminals of the N ADCs, with a test frequency that is slightly offset from an integer multiple of the sampling rate of each ADC (determined by the sampling clock frequency). A beat frequency test signal is produced at each ADC output terminal, because of the offset of the test frequency from an integer multiple of the clock frequency. Zero crossing positions, or some other convenient phase reference point, of the beat frequency signal should be spaced apart by uniform time intervals, if the ADC clock delays are properly staggered, with the phase difference corresponding to the number of time-interleaved ADCs and to the clock rate for the system. Clock delays in each of the ADC clock paths are then adjusted with voltage-controlled variable delay gates, or equivalent circuitry, until the zero crossing positions are properly spaced.

There is no requirement that the fractional offset frequency set by the test frequency be exactly known a priori, because the period of the offset frequency can be determined by taking the difference between successive zero crossing positions in any one of the ADC output signals.

In a similar manner, the beat frequency test signal is used to determine amplitude mismatch errors (due to gain or frequency response differences) between the ADCs. The amplitudes of the individual ADC output sine waves should be identical if the ADCs are perfectly matched. If differences in these amplitudes occur, a full scale or bandwidth adjustment circuit is used to correct the error(s).

BEST MODE FOR CARRYING OUT THE INVENTION

Figure 1:
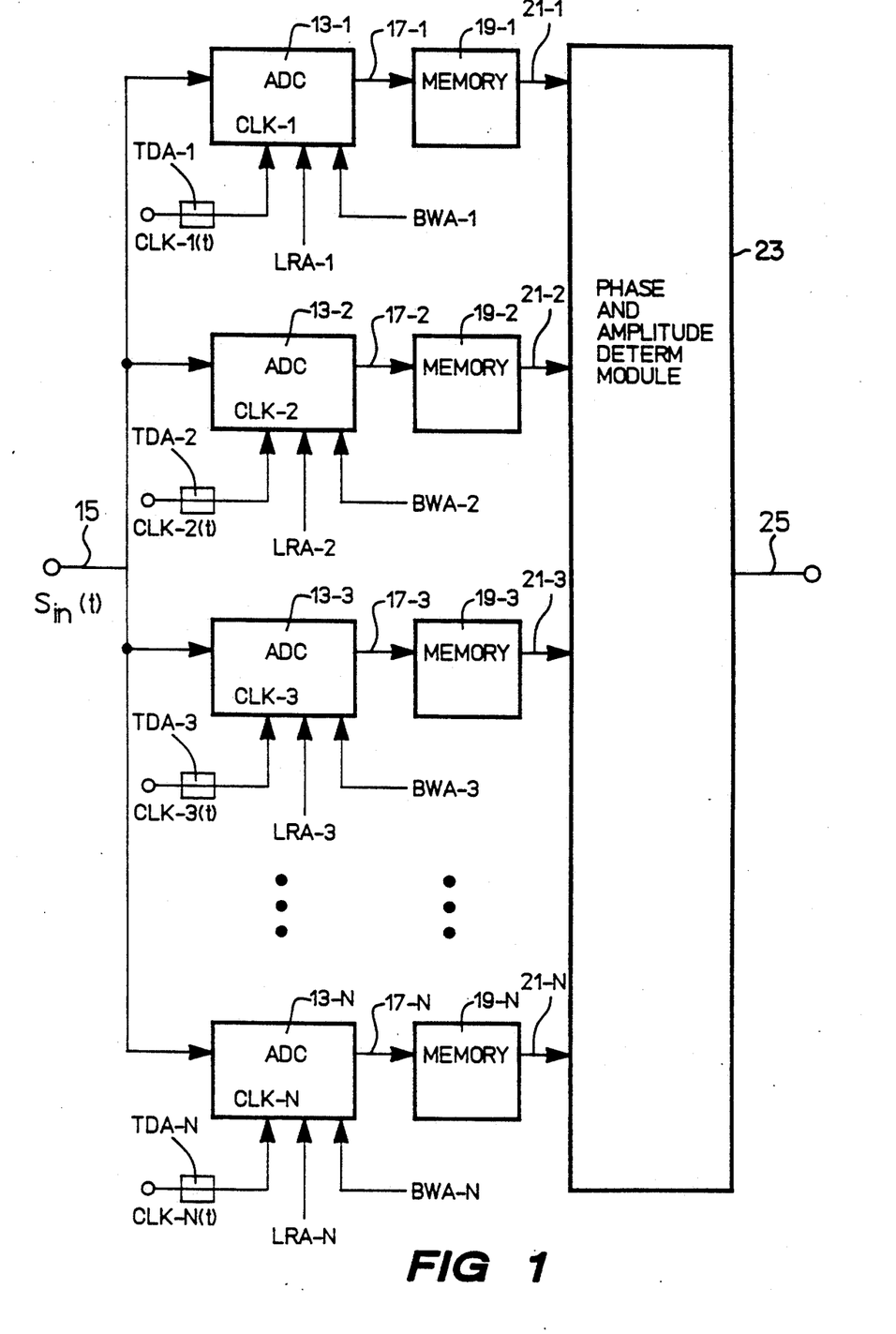
FIG. 1 is a schematic view of an embodiment of the invention that includes N ADCs and accepts N time-interleaved clock pulse sequences and a calibration signal $S_{in}$, and detects and measures timing and amplitude errors included therein.
Figure 2:
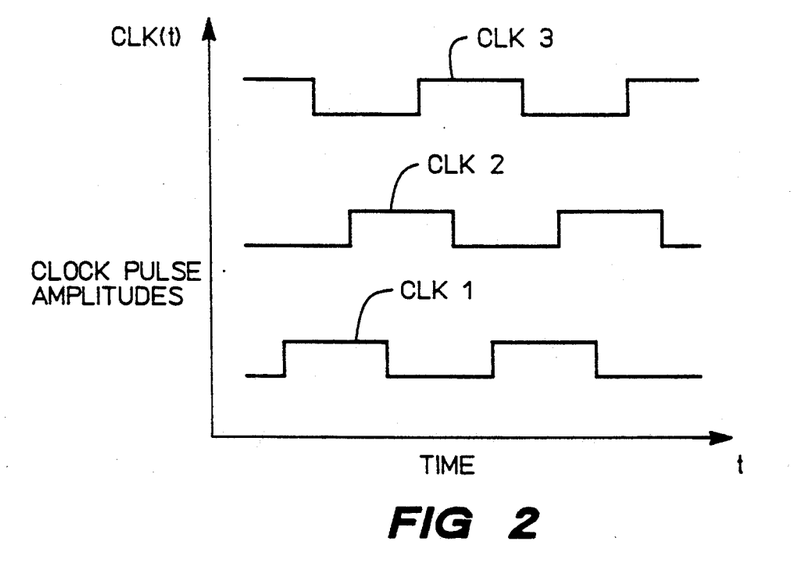
FIG. 2 graphically illustrates the time relationship of three clock pulse amplitudes corresponding to three clock pulse sequences.

With reference to FIG. 1, an embodiment 11 of apparatus for practicing the invention includes a plurality of N analog-to-digital converters ("ADCs"), numbered 13-1, 13-2, 13-3, ..., 13-N, as shown. Each ADC 13-j (j=1, 2, ..., N) includes an analog input terminal, a clock input terminal CLK-j, a clock time delay adjustment module TDA-j (optional), a bandwidth adjustment terminal BWA-j (optional), a linear scale adjustment terminal LRA-j (optional) and a data output terminal. An input signal line 15 carries a test input signal $S_{in}(t)$ to the analog input terminal of each of the ADCs 13-j. The test input signal $S_{in}(t)$ is chosen to be a sine wave, namely $$S_{in}(t) = A \sin[2\pi(1+s)f_c t]. \quad (1)$$

where s is a non-zero fractional number, satisfying the relation $-0.50 < s < 0.50$ (preferably, $|s| < 0.1$). The clock input terminal of each of the ADCs 13-j receives a clock pulse sequence CLKj(t) (with frequency $f_c$ and period $T_c$), where the clock pulse sequences are staggered in time with respect to one another in a manner illustrated in FIG. 2 for the case N=3. For definiteness here, assume that each ADC 13-j samples the analog input signal $S_{in}(t)$ at the time the ADC receives the rising edge from the clock pulse sequence CLKj(t) at a time $t_i = i T_c$ and produces an output signal value $D_j(t_i) = D_{ij}$ (i=1, 2, ..., N).

The output signal values $D_{ij}$ from the ADC 13-j (j=1, 2, ..., N) are received on a transport line 17-j in FIG. 1 by a memory module 19-j, and are stored therein sequentially for subsequent analysis by a phase and amplitude determination module 23. The phase and amplitude determination module 23 then finds the sine wave representation (for each j=1, 2, ..., N)

$$V_j(t) = A_j \sin(2\pi s f_c t + \phi_j) \quad (2)$$

that best represents the set of ordered pairs or data points $(t_i, D_{ij})$ (i=1, 2, ..., for each j=1, 2, ..., N). $A_j$ is the amplitude and $\phi_j$ is the phase angle associated with the ADC 13-j in this procedure. Note that the frequency of a sine wave presentation $V_j(t)$ in Equation (2) is $sf_c$, whereas the input calibration frequency for the signal $S_{in}(t)$ in Equation (1) is $(1+s)f_c$. The frequency translation from $(1+s)f_c$ in the input signal to $sf_c$ in the output signal of an ADC is a natural result of use of the ADC input sampling frequency $f_c$. Furthermore, if an ideal phase difference $2\pi(j2-j1)/N$ is present in the sampling operations of two ADCs 13-j1 and 13-j2 at a frequency $f_c$, a phase difference (ideal) $\Delta\Phi_{j2,j1}$ of the same value at the frequency $sf_c$ will appear in the sine wave representations $V_{j1}(t)$ and $V_{j2}(t)$, i.e.

$$\Delta\Phi_{j2,j1} = 2\pi(j2-j1)/N \,(1 \leq j1 < j2 \leq N). \quad (3)$$

The measured phase differences, denoted $\Delta\phi_{j2,j1} = \phi_{j2} - \phi_{j1}$ ($1 \leq j1 < j2 \leq N$), are compared with the corresponding desired phase differences $\Delta\Phi_{j2,j1}$ in Equation (3). If at least one of these phase differences differs from the corresponding desired value by more than a small predetermined error or timing inaccuracy, as indicated in an error signal at an output 25, at least one of the ADCs 13-j1 and 13-j2 contains a timing error. Similarly, if any amplitude difference $A_{j1} - A_{j2}$ differs from zero by more than a small predetermined amount, as indicated in the error output signal at the output 25, then at least one of the ADCs 13-j1 and 13-j2 contains an amplitude error.

Alternatively, the frequency of the input test signal $S_{in}(t)$ can be slightly offset from an integer multiple of $f_c$, for example $f_{in} = (R+s)f_c$, where R is a selected positive integer. This input frequency $f_{in}$ will still be translated by the sampling operation of the ADCs to an output frequency $sf_c$. However, the ideal phase difference between the ADCs j1 and j2 becomes $2\pi R(j2-j1)/N$ in this instance.

Figure 3:
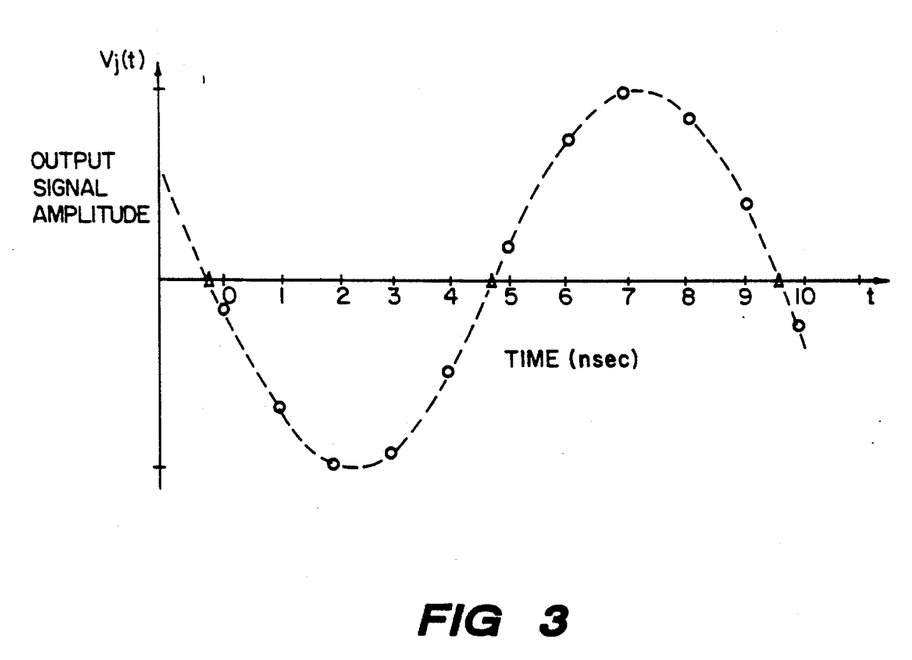
FIG. 3 graphically illustrates the envelope of the output signal that issues from an output terminal of an individual ADC, when the apparatus in FIG. 1 is operated according to the invention.
Figure 4:
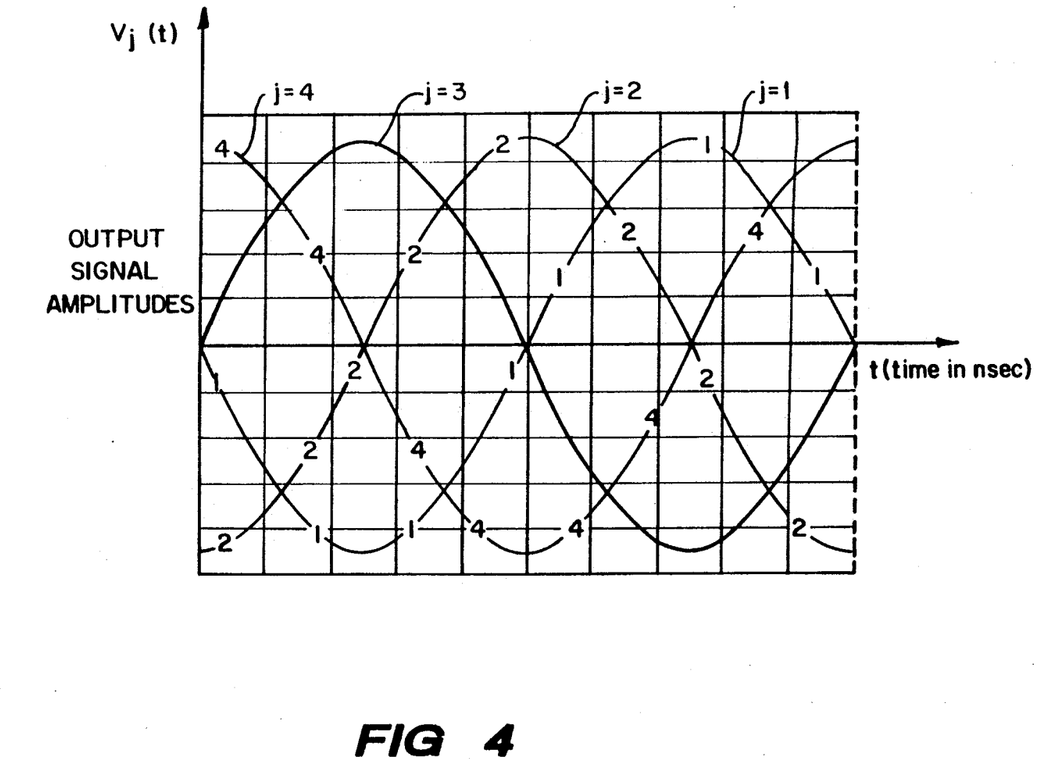
FIG. 4 graphically illustrates the envelopes of the four output signals, separated in phase by multiples of approximately $\pi/2$, that issue from four ADCs (N=4), when the apparatus in FIG. 1 is operated according to the invention.

FIG. 3 illustrates an output signal of a representative ADC 13-j as a function of time, with $f_c = 1$ GHz and $s = +0.1$. The translated frequency produced by the sampling action of ADC 13-j on the input signal $S_{in}(t)$ is then 1.1 GHz − 1.0 GHz = 100 MHz. In FIG. 3, the small circles (○) indicate the values sampled by ADC number 13-j at the clock rate $f_c$, i.e., the set of points $(t_i, D_{ij})$. The dashed line represents a best fit of a 100 MHz sine wave to the sampled data, with an amplitude $A_j$ and a phase $\phi_j$ that best match the sine wave representation $V_j(t) = A_j \sin[2\pi(100 \text{ MHz})t + \phi_j]$ to the sequence of data points $\{(t_i, D_{ij})\}_i$ with j fixed. FIG. 4 illustrates the phase relationships of the sine wave representations $V_j(t)$ for a system with N=4 ADCs, operated under the same conditions. The phase relationships of the four ADCs satisfy Equation (3), and the ADCs are ideal or perfect; that is, the ADCs have no timing or amplitude mismatches.

The measured phase differences $\Delta\phi_{j2,j1}$ for two ADCs may be determined by several methods. A first method determines two or more same-direction zero crossing points $t_z(j,k)$ (k=1, 2, ...; j fixed) from the output signals received by the memory module 19-j in FIG. 1. If the frequency offset $|s|$ is very small, a same-direction zero crossing point may be determined from the values $D_{ij}$ by simple linear interpolation between these values. A same-direction zero crossing point $t_z(j,k)$ is any abscissa value for which the ordinate value is zero and for which the ordinate values near that abscissa value are always increasing or always decreasing for increasing abscissa values. The index k indicates the number of same-direction zero crossings (k=1, 2, ...), measured from the beginning of the data record of the ADC 13-j.

The phase angle $\phi_j$ is then determined by the relation $$\phi_j = [2\pi t_z(j,k)/T_j](\text{mod } 2\pi), \tag{4}$$

where $T_j$ is a time period determined by the relation $$T_j = \Delta t_z(j,k) = t_z(j,k+1) - t_z(j,k). \tag{5}$$

As an alternative approach, a sequence of same-direction zero crossing points $t_z(j,kq)$ (q=1, 2, ..., L) can be determined with k1<k2<...<kL. The phase angle $\phi_j$ is then determined by the relations $$\phi_j = [2\pi t_z(j,k)/T_j'] \text{ (mod } 2\pi), \tag{6}$$

$$T_j' = \sum_{q=1}^{L} \Delta t_z(j,kq)/L, \tag{7}$$

where j is a selected integer for which $t_z(j,kq)$ is known. Another alternative approach is to determine the phase angle $\phi_j$ by the relation $$\phi_j = (1/L)\sum_{q=1}^{L}[2\pi t_z(j,kq)/T_j' \text{ (mod } 2\pi)], \tag{8}$$

where $T_j'$ is determined as in Equation (7).

If |s| is not small, some errors will occur using this procedure. To reduce these errors, an interpolating low pass digital filter can be used to generate additional data points interspersed among the original sequence of data points ({$t_i$, $D_{ij}$})$_i$. An interpolating, low pass digital filter, which may be part of the phase and amplitude determination module 23, receives the sequence of data points ($t_i$, $D_{ij}$) (i=1, 2, ...) and produces and issues an interpolated "enriched" sequence of data points ($t_h'$, $D_{hj}'$) corresponding to a sequence of interpolation times $t_h'$ (h=1, 2, ...) that may include the original times $t_i$. The sequence {($t_h'$, $D_{hj}'$)}$_h$ (j fixed) is then used to determine a sequence of same-direction zero crossing points $t_z'(j,k)$ as before for the sequence of values $D_{hj}'$, and the phase angle $\phi_j$ is determined as in Equations (4)-(8) above.

Assume that the measured phase angles $\phi_j$ (j=1, 2, ..., N) have been determined. If the measured phase angle differences $\Delta\phi_{j2,j1}$ do not coincide with the ideal phase angle differences $\Delta\Phi_{j2,j1}$ determined in Equation (3), further improvement is possible. The independently adjustable time delay input control signals TDA-j1 and TDA-j2 on the respective clock terminals number j1 and j2 are adjusted to minimize the difference $$\Delta_{j2,j1} = |\Delta\Phi_{j2,j1} - \Delta\phi_{j2,j1}|. \tag{9}$$

In practice, if one of these differences is minimized, one or more of the other differences $\Delta_{j2,j1}$ will be decreased. An alternative approach here is to adjust the adjustable time delay input control signals TDA-j (j=1, 2, ..., N) so that the sum $$\Delta\phi = \sum_{j2=2}^{N} |\Delta\Phi_{j2,j2-1} - \Delta\phi_{j2,j2-1}| \tag{10}$$

is minimized.

Ideally, the amplitudes $A_j$ of the sine waves $V_j(t)$, as determined by the phase and amplitude determination module 27, are equal to each other. To determine whether equality, or near equality, prevails here, the amplitude differences $$\Delta A_{j2,j1} = |A_{j2} - A_{j1}| (1 \leq j1 < j2 < J) \tag{11}$$

are formed, and these J(J−1)/2 amplitude differences are compared with a selected small positive threshold number $\Delta A$ (>0). If one or more of these amplitude differences satisfies the inequality $$\Delta A_{j2,j1} > \Delta A, \tag{12}$$

at least one of the two ADCs 13-j1 and 13-j2 is presumed to have an amplitude error.

In one approach for determining the amplitudes $A_j$ for the sine waves $V_j(t)$, one begins by determining at least two consecutive same-direction zero crossings $t_z(j,k)$ and $t_z(j,k+1)$ from the set of ordered pair values ($t_i$, $D_{ij}$), by linear interpolation between the values $D_{ij}$ (i=1, 2, ...). The set of consecutive time indices $t_i$(i=1, 2, ...) is assumed to extend over a range greater than a period $T_c/|s|$ of the sine function $T_j(t)$ in Equation (2), so that the set of values $D_{ij}$ has at least one local minimum and at least one local maximum. Let $D_{min,j}$ and $D_{max,j}$ be the absolute minimum and absolute maximum, respectively, for the set of values $D_{ij}$. The amplitude $A_j$ for the sine wave function $V_j(t)$ may then be determined approximately by the relation $$A_j = (D_{max,j} - D_{min,j})/2. \tag{13}$$

Alternatively, one can determine L pairs of maximum and minimum values, $D_{max,j,q}$ and $D_{min,j,q}$ (q=1, 2, ..., L), of an extended set of values $D_{ij}$. An average of differences $$\Delta D_j = \sum_{q=1}^{L} [D_{max,j,q} - D_{min,j,q}]/L \tag{14}$$

is then determined, and an amplitude $A_j$ is defined approximately by the relation $$A_j = \Delta D_j/2. \tag{15}$$

As a second alternative approach, an interpolating, low pass, digital filter is applied to the set of data pairs {($t_i$, $D_{ij}$)}$_i$ to produce a new set of data pairs {($t'_h$, $D'_{hj}$)}$_h$ that may include the original set of data pairs ($t_i$, $D_{ij}$). The new set of data pairs ($t'_h$, $D'_{hj}$) may then be used to determine the absolute maximum value, $D'_{max,j}$, and the absolute minimum value, $D'_{min,j}$, from among the values $D'_{hj}$. The amplitude $A_j$ is then determined approximately by the relation $$A_j = (D'_{max,j} - D'_{min,j})/2. \tag{16}$$

As a third alternative approach, one can determine N pairs of maximum and minimum values $D'_{max,j,q}$ and $D'_{min,j,q}$ (q=1, 2, ..., N) from an extended set of values $D'_{hj}$. An average of differences $$\Delta D_j = \sum_{q=1}^{N} [D_{max,j,q}' - D_{min,j,q}']/N \tag{17}$$

is determined, and an amplitude $A_j$ is defined approximately by the relation $$A_j = \Delta D'_j/2. \tag{18}$$

If the inequality in Equation (12) is satisfied for two ADCs 13-j1 and 13-j2, the full scale linear range of at least one of these two ADCs can be adjusted so that the resulting amplitudes $A_{j1}$ and $A_{j2}$ now satisfy $$|A_{j2} - A_{j1}| \leq A. \tag{19}$$

Adjustment of the full scale linear range of at least one of the two ADCs, 13-j1 and 13-j2 to satisfy the inequality in Equation (19) may produce another pair of ADCs 13-j3 and 13-j4, for which $$|A_{j4} - A_{j3}| > \Delta A. \tag{20}$$

Thus, the full scale linear ranges of several, or even all, of the ADCs may have to be adjusted simultaneously so that the inequality in Equation (12) is not satisfied for any pair of ADCs.

As an alternative approach to the procedure in the preceding paragraph, the bandwidth of one or more of the ADCs can be adjusted so that the inequality of Equation (26) is satisfied for all pairs j1 and j2 of the ADCs.

Another alternative technique determines the amplitudes $A_j$ and the phase angles $\phi_j$ in Equation (2) to achieve a "best fit" to the data point sequences $\{(t_i, D_{ij})\}_i$ for one, several or all of the ADCs 13-j (j=1, 2, ..., N).

For example, the phase angles $\phi_j$ and the amplitudes $A_j$ in Equation (2) can be simultaneously chosen so that the sum of differences $$\epsilon_j = \sum_{i=1}^{K} |D_{ij} - A_j \sin[2\pi s f_c t_i + \phi_j]|^\alpha \tag{21}$$

is minimized, where K is the number of pairs in the set $\{(t_i, D_{ij})\}_i$ used and $\alpha$ is a selected positive number, for example $\alpha = 0.5$, 1 or 2.

As a second approach, one can perform a discrete Fourier transform on a set of data points $\{(t_i, D_{ij})\}_i$, with j fixed, and express this Fourier transform in phase and magnitude form as $F_{p,j} \exp[-\iota \Phi_{p,j}]$ ($F_{p,j} \geq 0$; $\iota^2 = -1$) for each frequency component p. One then determines the frequency component p=p0 having the largest magnitude $F_{p,j}$ and determines the amplitude $A_j$ and the phase angle $\phi_j$ for that data set by the relations $$A_j = F_{p0,j}, \tag{22}$$

$$\phi_j = \Phi_{p0,j}. \tag{23}$$

This procedure may be repeated for each integer j=1, 2, ..., N.

In either of these approaches, one can: (1) adjust the time delays for at least one of the ADCs 13-j1 and 13-j2 so that the phase angle error $|\Delta\Phi_{j2,j1} - \Delta\phi_{j2,j1}|$ is less than a selected positive phase angle error number $\Delta\phi$ ($1 \leq j1 < j2 \leq N$); and (2) adjust the full scale linear range of at least one of the ADCs 13-j3 and 13-j4 so that the amplitude error $|A_{j3} - A_{j4}|$ is less than a selected positive amplitude error number $\Delta A$ ($1 \leq j1 < j2 \leq N$).

Alternatively, one can: (1) adjust the time delays for at least one of the ADCs 13-j1 and 13-j2 so that the phase angle error $|\Delta\Phi_{j2,j1} - \Delta\phi_{j2,j1}|$ is less than a selected positive phase angle error number $\Delta\phi$ ($1 \leq j1 < j2 \leq N$); and (2) adjust the bandwidth of at least one of the ADCs 13-j3 and 13-j4 so that the amplitude error $|A_{j3} - A_{j4}|$ is less than a selected positive amplitude error number $\Delta A$ ($1 \leq j1 < j2 \leq N$).

The calibration techniques discussed here, for determination and/or correction of timing and amplitude gain errors in a plurality of analog-to-digital converters, are examples of a broad variety of calibration procedures that can be applied, by identifying and reducing phase angle errors and/or amplitude errors that may occur as a result of such timing and/or gain errors. Modification and expansion of these techniques may be made without departing from the scope of the invention.

I claim:

1. A method for calibrating a plurality of J analog-to-digital converters for any integer $J \geq 2$, the method comprising the steps of:

providing J analog-to-digital converters, numbered j=1, 2, ..., J, each converter having the same clock frequency $f_c$ and period $T_c = 1/f_c$ and having an input terminal, a clock input terminal and an output terminal, with analog-to-digital converter number j receiving clock pulse sequence number j at the clock input terminal thereof and each clock pulse sequence having an independently adjustable time delay;

generating a sinusoidal input signal of frequency $f_{in} = (R+s)f_c$, where s is a non-zero fractional number satisfying $-0.5 < s < 0.5$ and R is a positive integer, and delivering this input signal to the input terminal of each of the converters;

for a predetermined time interval that includes at least $1/|s|$ consecutive clock pulses from each clock pulse sequence numbered j=1, 2, ..., J, storing a sequence of output signal values, denoted $D_{ij}$ (i=1, 2, ..., K), appearing at the output terminal of converter number j, where K is a positive integer satisfying $K \geq 1/|s|$, and storing a time index $t_i = iT_c$ associated with each value $D_{ij}$;

expressing each set of ordered pairs $\{t_i, D_{ij}\}_i$, with j fixed, approximately as a sine wave $V_j(t) = A_j \cdot \sin[2\pi s f_c t + \phi_j]$, and determining an amplitude $A_j$ and a phase angle $\phi_j$ associated with converter number j for the set of values $\{t_i, D_{ij}\}_i$; and comparing the phase differences $\Delta\phi_{j2,j1} = \phi_{j2} - \phi_{j1}$ for $1 \leq j1 < j2 \leq J$ with a corresponding desired phase difference number $\Delta\Phi_{j2,j1} = 2\pi R(j2-j1)/J$ and, when the absolute difference $|\Delta\Phi_{j2,j1} - \Delta\phi_{j2,j1}|$ is larger than a selected positive phase angle error number $\Delta\Phi$, determining that at least one of the converters number j1 and j2 has a phase err and when a phase error occurs in at least one of the converters number j1 and j2, adjusting a time delay of at least one clock pulse sequence so that the absolute difference $|\Delta\Phi_{j2,j1} - \Delta\phi_{j2,j1}|$ is no greater than $\Delta\Phi$.

2. The method of claim 1, wherein said step of determining at least one of said phase angles $\phi_j$ for said sine wave $V_j(t)$ comprises the steps of:

determining at least two consecutive same-direction zero crossings, denoted $t_z(j,k)$ and $t_z(j,k+1)$, of a function represented by the set of ordered pairs $\{t_i, D_{ij}\}_i$, with j fixed, by linear interpolation between said values $D_{ij}$;

forming a temporal difference $\Delta t_z(j,k) = t_z(j,k+1) - t_z(j,k)$ and defining a period T as $T = \Delta t_z(j,k)$; and determining said phase angle $\phi_j$ by the relation $\phi_j = [2\pi t_z(j,k)/T] \pmod{2\pi}$.

3. The method of claim 2, wherein said step of determining at least one of said phase angles $\phi_j$ for said sine wave $V_j(t)$ comprises the steps of:

determining L sets of two consecutive same-direction zero crossings, denoted $t_z(j,k)$ and $t_z(j,k+1)$, for $K = K1, K2, \ldots, kL$, where $k1, k2, \ldots$ and $kL$ are L distinct positive integers with $L \geq 2$, of the function represented by the set of ordered pairs $\{t_i, D_{ij}\}_i$, with j fixed, by linear interpolation between said values $D_{ij}$; and forming a sequence of periods $T_{j,k} = \Delta t_z(j,k) = t_z(j,k+1) - t_z(j,k)$ for $k = k1, K2, \ldots, kL$ and defining said phase angle $\phi_j$ by the relation $$\phi_j = (1/L) \sum_{q=1}^{L} [2\pi t_z(j,kq)/T_{j,kq} \pmod{2\pi}].$$

4. The method of claim 1, wherein said step of determining at least one of said phase angle $\phi_j$ for said sine wave $V_j(t)$ comprises the steps of:

applying to an interpolating digital low pass filter at least one of said data sets $\{t_i, D_{ij}\}_i$ of pairs to generate a new data set of M pairs $(M >> K)$, denoted $\{t_h', D_{hj}'\}_h$, where $D_{hj}'$ is an interpolated value corresponding to a time value $t_h'$ produced by the interpolating digital low pass filtration applied to said data sets $\{t_i, D_{ij}\}_i$;

determining at least two consecutive same-direction zero crossings, denoted $t_z(j,k)$ and $t_z(j,k+1)$, of the function represented by the set of ordered pairs $\{t_h', D_{hj}'\}_h$, with j fixed, by linear interpolation between said values $D_{hj}'$;

forming the temporal difference $\Delta t_z(j,k) = t_z(j,k+1) - t_z(j,k)$ and defining a period T as $T = \Delta t_z(j,k)$; and determining said phase angle $\phi_j$ by the relation $\phi_j = [2\pi t_z(j,k)/T] \pmod{2\pi}$.

5. The method of claim 4, wherein said step of determining at least one of said phase angles $\phi_j$ for said sine wave $V_j(t)$ comprises the steps of:

determining N sets of two consecutive same-direction zero crossings, denoted $t_z(j,k)$ and $t_z(j,k+1)$, of said interpolated signal values $D_{hj}'$ for $k = k1, k2, \ldots, kN$, where $k1, k2, \ldots$ and, kN are N distinct positive integers with $N \geq 2$, of the function represented by the set of ordered pairs $\{t_h', D_{hj}'\}_h$, with j fixed, by linear interpolation between said values $D_{hj}'$; and forming a sequence of periods $T_{j,k} = \Delta t_z(j,k) = t_z(j,k+1) - t_z(j,k)$ for $k = k1, k2, \ldots, kN$ and defining said phase angle $\phi_j$ by the relation $$\phi_j = (1/N) \sum_{q=1}^{N} [2\pi t_z(j,kq)/T_{j,kq} \pmod{2\pi}].$$

6. A method for calibrating a plurality of J analog-to-digital converters for any integer $J \geq 2$, the method comprising the steps of:

providing J analog-to-digital converters, numbered $j = 1, 2, \ldots, J$, each converter having the same frequency $f_c$ and period $T_c = 1/f_c$ and having an input terminal, a clock input terminal and an output terminal, with analog-to-digital converter number j receiving clock pulse sequence number j at the clock input terminal thereof, with each converter allowing an adjustment of amplitude of the output signal of the converter;

generating a sinusoidal input signal of frequency $f_{in} = (R+s)f_c$, where s is a fractional number satisfying $-0.5 < s < 0.5$, $s \neq 0$, and R is a positive integer, and delivering this input signal to the input terminal of each of the converters;

for a predetermined time interval that includes at least $1/|s|$ consecutive clock pulses from each clock pulse sequence numbered $j = 1, 2, \ldots, J$, storing a sequence of output signal values, denoted $D_{ij}(i = 1, 2, \ldots, K)$, appearing at the output terminal of converter number j, where K is a positive integer satisfying $K > 1/|s|$, and storing a time index $t_i = iT_c$ associated with each value $D_{ij}$;

expressing each set of ordered pairs $\{t_i, D_{ij}\}_i$, with j fixed, approximately as a sine wave $V_j(t) = A_j \sin[2\pi s f_c t + \phi_j]$, and determining an amplitude $A_j$ and a phase angle $\phi_j$ associated with converter number j for the set of values $\{t_i, D_{ij}\}_i$; and determining the amplitude differences $\Delta A_{j2,j1} = A_{j2} - A_{j1}$ for $1 \leq j1 < j2 \leq J$ and, when the absolute difference of at least one of these amplitude differences is larger than a selected positive amplitude number $\Delta A$, determining that at least one of the converters number j1 and j2 has an amplitude error; and when an amplitude error occurs in at least one of the converters number j1 and j2, adjusting an output signal amplitude of at least one of the converters so that the amplitude difference magnitude $|\Delta A_{j2,j1}|$ is no greater than $\Delta A$.

7. The method of claim 6, wherein said step of determining at least one of said amplitudes $A_j$ for said sine wave $V_j(t)$ comprises the steps of:

determining at least two consecutive same-direction zero crossings, denoted $t_z(j,k)$ and $t_z(j,k+1)$, of a function represented by the set of ordered pairs $\{t_i, D_{ij}\}_i$, with j fixed, by linear interpolation between said values $D_{ij}$;

forming a temporal difference $\Delta t_z(j,k) = t_z(j,k+1) - t_z(j,k)$ and defining a period T as $T = \Delta t_z(j,k)$;

providing a set of ordered pairs $\{t_i, D_{ij}\}_i$ for which the values of said variable $t_i$ have a range greater than T, and determining the maximum of said values $D_{ij}$, denoted $D_{max,j}$, and the minimum of said values $D_{ij}$, denoted $D_{min,j}$, within this set of values; and defining said amplitude $A_j$ by the relationship $A_j = (D_{max,j} - D_{min,j})/2$.

8. The method of claim 7, wherein said step of determining at least one of said amplitudes $A_j$ for said sine wave function $V_j(t)$ comprises the steps of:

determining L pairs of said maximum values and said minimum values $D_{max,j}$ and $D_{min,j}$, denoted $\{D_{max,j,q}, D_{min,j,q}\}_q$, for $q = q1, q2, \ldots, qL$, where $q1, q2, \ldots$ and, qL are L distinct positive integers with $L \geq 2$, for the function represented by the set of ordered pairs $\{t_i, D_{ij}\}_i$, with j fixed;

forming an average of differences $$\Delta D_j = \sum_{q=1}^{L} [D_{max,j,q} - D_{min,j,q}]/L; \text{ and}$$

determining said amplitude $A_j$ by the relationship $A_j = \Delta D_j/2$.

9. The method of claim 6, wherein said step of determining at least one of said amplitudes $A_j$ for said sine wave $V_j(t)$ comprises the steps of:

applying an interpolating digital low pass filter to at least one of said data sets $\{t_i, D_{ij}\}_i$ of pairs to generate a new data set of M pairs with M>>K, denoted $\{t_h', D_{hj}'\}_h$, where $D_{hj}'$ is a value corresponding to a time value $t_h'$ produced by applying the interpolating digital low pass filter to said data sets $\{t_i, D_{ij}\}_i$, with j fixed, before said amplitude $A_j$ is determined;

determining at least two consecutive same-direction zero crossings in the same direction, denoted $t_z(j,k)$ and $t_z(j,k+1)$, of the function represented by the set of ordered pairs $\{t_h', D_{hj}'\}_h$, with j fixed, by linear interpolation between said values $D_{hj}'$;

forming a temporal difference $\Delta t_z(j,k) = t_z(j,k+1) - t_z(j,k)$ and defining a period T as $T = \Delta t_z(j,k)$;

providing a set of ordered pairs $\{t_i, D_{ij}\}_i$ for which the values of said variable $t_i$ have a range greater than T, and determining the maximum of said values $D_{ij}$, denoted $D_{max,j}$, and the minimum of said values $D_{ij}$, denoted $D_{min,j}$, within this set of values; and defining said amplitude $A_j$ by the relationship $A_j = (D_{max,j} - D_{min,j})/2$.

10. The method of claim 9, wherein said step of determining at least one of said amplitudes $A_j$ for said sine wave function $V_j(t)$ further comprises the steps of:

determining N pairs of said maximum values and said minimum values $D_{max,j}$ and $D_{min,j}$, denoted $\{D_{max,j,q}, D_{min,j,q}\}_q$, for $q = q1, q2, \ldots, qN$, where $q1, q2, \ldots,$ and $qN$ are N distinct positive integers with $N \geq 2$, for the function represented by the set of ordered pairs $\{t_h', D_{hj}'\}_h$, with j fixed;

forming an average of temporal differences $$\Delta D_j = \sum_{q=1}^{N} [D_{max,j,q} - D_{min,j,q}]/N; \text{ and}$$

determining said amplitude $A_j$ by the relationship $A_j = \Delta D_j/2$.

11. The method of claim 6, wherein each of said analog-to-digital converters allows adjustment of the full scale linear range of the input signal for said converter, and wherein the step of adjusting an amplitude output signal of at least one of said converters comprises adjusting the full scale linear range of operation of at least one of said converters number j1 and j2 so that, after such adjustment, said amplitude difference magnitude $|\Delta A_{j2,j1}|$ is no greater than said selected positive number $\Delta A$.

12. The method of claim 6, wherein each of said analog-to-digital converters allows adjustment of the bandwidth of the input signal for said converter, and wherein the step of adjusting an amplitude output signal of at least one of said converters comprises adjusting the bandwidth of at least one of said converters number j1 and j2 so that, after such adjustment, said absolute magnitude of said difference $|\Delta A_{j2,j1}|$ is less than said selected positive number $\Delta A$.

13. A method for calibrating a plurality of J analog-to-digital converters for any integer $J \geq 2$, the method comprising the steps of:

providing J analog-to-digital converters, numbered $j = 1, 2, \ldots, J$, each converter having the same frequency $f_c$ and period $T_c = 1/f_c$ and having an input terminal, a clock input terminal and an output terminal, with analog-to-digital converter number j receiving clock pulse sequence number j at the clock input terminal thereof, with each clock pulse sequence having an independently adjustable time delay, and with each converter allowing an adjustment of amplitude of the output signal of the converter;

generating a sinusoidal input signal of frequency $f_{in} = (R+s)f_c$, where s is a non-zero fractional number satisfying $-0.5 < s < 0.5$ and R is a non-zero integer, and delivering this input signal to the input terminal of each of the converters;

for a predetermined time interval that includes at least $1/|s|$ consecutive clock pulses from each clock pulse sequence numbered $j = 1, 2, \ldots, J$, storing a sequence of output signal values, denoted $D_{ij}(i = 1, 2, \ldots, K)$ with j fixed, appearing at the output terminal of converter number j, where K is a positive integer satisfying $K > 1/|s|$, and storing a time index $t_i = iT_c$ associated with each value $D_{ij}$;

expressing each set of ordered pairs $\{t_i, D_{ij}\}_i$, with j fixed, approximately as a sine wave $V_j(t) = A_j \sin[2\pi s f_c t + \phi_j]$, and determining an amplitude $A_j$ and a phase angle $\phi_j$ associated with converter number j for the set of values $\{t_i, D_{ij}\}_i$;

comparing the phase differences $\Delta \phi_{j2,j1} = \phi_{j2} - \phi_{j1}$ for $1 \leq j1 < j2 \leq N$ with a corresponding desired phase difference number $\Delta \Phi_{j2,j1} = 2\pi R(j2-j1)/N$ and, if the absolute difference $|\Delta \Phi_{j2,j1} - \Delta \phi_{j2,j1}|$ is larger than a selected positive phase angle error number $\Delta \Phi$, determining that at least one of the converters number j1 and j2 has a phase error;

determining the amplitude differences $\Delta A_{j4,j3} = A_{j4} - A_{j3}$ for $1 \leq j3 < j4 \leq J$ and, when the absolute difference of at least one of these amplitude differences is larger than a selected positive amplitude error number $\Delta A$, determining that at least one of the converters number j3 and number j4 has an amplitude error;

when a phase error occurs in at least one of the converters number j1 and j2, adjusting a time delay of at least one clock pulse sequence so that the absolute difference $|\Delta \Phi_{j2,j1} - \Delta \phi_{j2,j1}|$ is no greater than $\Delta \Phi$; and when an amplitude error occurs in at least one of the converters number j3 and j4, adjusting an output signal amplitude of at least one of the converters so that the amplitude difference magnitude $|\Delta A_{j4,j3}|$ is no greater than $\Delta A$.

14. The method of claim 13, wherein said steps of determining at least one of said amplitudes $A_j$ and at least one of said phase angles $\phi_j$ comprise the steps of:

choosing said amplitude $A_j$ and said phase angle $\phi_j$ so that the sum of differences $$\epsilon_j = \sum_{i=1}^{K} |D_{ij} - A_j \sin[2\pi s f_c t_i + \phi_j]|^\alpha$$

is minimized for a selected positive number $\alpha$, where K is the number of pairs in said set $\{t_i, D_{ij}\}_i$.

15. The method of claim 13, wherein said steps of determining at least one of said amplitudes $A_j$ and at least one of said phase angles $\phi_j$ comprise the steps of:

performing a discrete Fourier transform on said set of values $\{t_i, D_{ij}\}_i$, with j fixed, and expressing this Fourier transform in phase and magnitude form $F_{p,j} \exp[-\iota \Phi_{p,j}]$ for each frequency component p, with j fixed;

determining the non-zero frequency component $p = p0$ having the largest magnitude $F_{p0,j}$, with j fixed;

determining said amplitude $A_j$ by the relationship $A_j = F_{p0,j}$; and determining said phase angle $\phi_j$ by the relationship $\phi_j = \Phi_{p0,j}$.

16. The method of claim 13, wherein each of said analog-to-digital converters allows adjustment of the full scale linear range of the input signal for said converter, the method further comprising the step of adjusting the full scale linear range of at least one of said converters number j3 and j4 so that, after such adjustment, said amplitude difference magnitude $|\Delta A_{j4,j3}|$ is no greater than $\Delta A$.

17. The method of claim 13, wherein each of said analog-to-digital converters allows adjustment of the bandwidth of the input signal for said converter, the method further comprising the step of adjusting the bandwidth of at least one of said converters number j3 and j4 so that, after such adjustment, said amplitude difference magnitude $|\Delta A_{j4,j3}|$ is no greater than $\Delta A$.

* * * * *